United States Patent
Hsu et al.

(10) Patent No.: US 9,859,335 B1
(45) Date of Patent: Jan. 2, 2018

(54) SEMICONDUCTOR DEVICE HAVING MEMORY CELL STRUCTURE

(71) Applicant: UNITED MICROELECTRONICS CORP., Hsinchu (TW)

(72) Inventors: Chia-Ching Hsu, Yunlin County (TW); Liang Yi, Singapore (SG); Shen-De Wang, Zhudong Township (TW); Ko-Chi Chen, Taoyuan (TW)

(73) Assignee: UNITED MICROELECTRONICS CORP., Hsinchu (TW)

(*) Notice: Subject to any disclaimer, the term of this patent is extended or adjusted under 35 U.S.C. 154(b) by 0 days.

(21) Appl. No.: 15/367,690

(22) Filed: Dec. 2, 2016

(51) Int. Cl.
*H01L 29/00* (2006.01)
*H01L 27/24* (2006.01)
*H01L 29/24* (2006.01)
*H01L 45/00* (2006.01)

(52) U.S. Cl.
CPC .......... *H01L 27/2463* (2013.01); *H01L 29/24* (2013.01); *H01L 45/04* (2013.01); *H01L 45/06* (2013.01); *H01L 45/1233* (2013.01); *H01L 45/145* (2013.01); *H01L 45/146* (2013.01); *H01L 45/147* (2013.01); *H01L 45/1683* (2013.01)

(58) Field of Classification Search
CPC .............. H01L 45/1233; H01L 45/146; H01L 27/2463; H01L 45/04; H01L 45/06; H01L 45/147; H01L 45/145; H01L 45/1683
See application file for complete search history.

(56) References Cited

U.S. PATENT DOCUMENTS

| 7,531,825 B2 | 5/2009 | Lai et al. | |
|---|---|---|---|
| 8,963,114 B2 | 2/2015 | Liao et al. | |
| 2013/0168628 A1* | 7/2013 | Hwang | H01L 45/06 257/1 |
| 2013/0221309 A1* | 8/2013 | Lee | H01L 45/085 257/2 |
| 2017/0069837 A1* | 3/2017 | Choi | H01L 43/12 |
| 2017/0092851 A1* | 3/2017 | Han | H01L 43/12 |
| 2017/0092852 A1* | 3/2017 | Son | H01L 43/12 |

(Continued)

OTHER PUBLICATIONS

Chia-Ching Hsu et al. Utility U.S. Appl. No. 15/359,975, filed Nov. 23, 2016.

(Continued)

*Primary Examiner* — Ngan Ngo
(74) *Attorney, Agent, or Firm* — WPAT, PC

(57) ABSTRACT

A semiconductor device includes an interconnection formed above a substrate, and the interconnection comprising interconnect layers respectively buried in dielectric layers; a lower conducting layer formed above the substrate; a memory cell structure formed on the lower conducting layer and buried in one of the dielectric layers; an upper conducting layer formed on the memory cell structure. The memory cell structure includes a bottom electrode formed on and electrically connected to the lower conducting layer; a transitional metal oxide (TMO) layer formed on the bottom electrode; and a top electrode formed on the TMO layer, wherein the upper conducting layer is formed on the top electrode and electrically connected to the top electrode. Also, the lower conducting layer and the upper conducting layer are positioned in the different dielectric layers.

19 Claims, 7 Drawing Sheets

(56) References Cited

U.S. PATENT DOCUMENTS

| | | | |
|---|---|---|---|
| 2017/0092858 A1* | 3/2017 | Shifren | H01L 49/003 |
| 2017/0104030 A1* | 4/2017 | Redaelli | H01L 27/2409 |
| 2017/0110653 A1* | 4/2017 | Seo | H01L 43/08 |
| 2017/0125672 A1* | 5/2017 | Ohba | H01L 45/085 |
| 2017/0148984 A1* | 5/2017 | Curioni | H01L 45/149 |

OTHER PUBLICATIONS

Liang Yi et al. Utility U.S. Appl. No. 15/260,754, filed Sep. 9, 2016.

* cited by examiner

US 9,859,335 B1

SEMICONDUCTOR DEVICE HAVING MEMORY CELL STRUCTURE

BACKGROUND

Technical Field

The disclosure relates in general to a semiconductor device, and more particularly to a semiconductor device having memory cell structures.

Description of the Related Art

Reduction of feature size, improvements of the rate, the efficiency, the density and the cost per integrated circuit unit are the important goals in the semiconductor technology. The electrical properties of the device have to be maintained even improved (ex: with the decrease of the size) to meet the requirements of the commercial products in applications. The layers and components with defects, such as position misalignment, incomplete profiles and thickness changes of the layers, would have considerable effects on the electrical performance of the device.

For example, during fabricating a resistive random-access memory (ReRAM) structure embedded in one of the dielectric layers of a semiconductor device in back end of line (BEOL) process, it is preferably maintain the same thickness of the dielectric layer. Different thicknesses of the dielectric layers lead to different RC delay, which has considerable effects on the electrical characteristics of the semiconductor device.

SUMMARY

The disclosure is directed to a semiconductor device having memory cell structures, and the thickness of the related dielectric (such as the IMD) layers of the semiconductor device can be maintained or reduced to meet the requirements of the application product.

According to one aspect of the present disclosure, a semiconductor device is provided, including an interconnection formed above a substrate, and the interconnection comprising interconnect layers respectively buried in dielectric layers; a lower conducting layer formed above the substrate; a memory cell structure formed on the lower conducting layer and buried in one of the dielectric layers; an upper conducting layer formed on the memory cell structure. The memory cell structure includes a bottom electrode formed on and electrically connected to the lower conducting layer; a transitional metal oxide (TMO) layer formed on the bottom electrode; and a top electrode formed on the TMO layer, wherein the upper conducting layer is formed on the top electrode and electrically connected to the top electrode. Also, the lower conducting layer and the upper conducting layer are positioned in the different dielectric layers.

DETAILED DESCRIPTION

Figure 1:
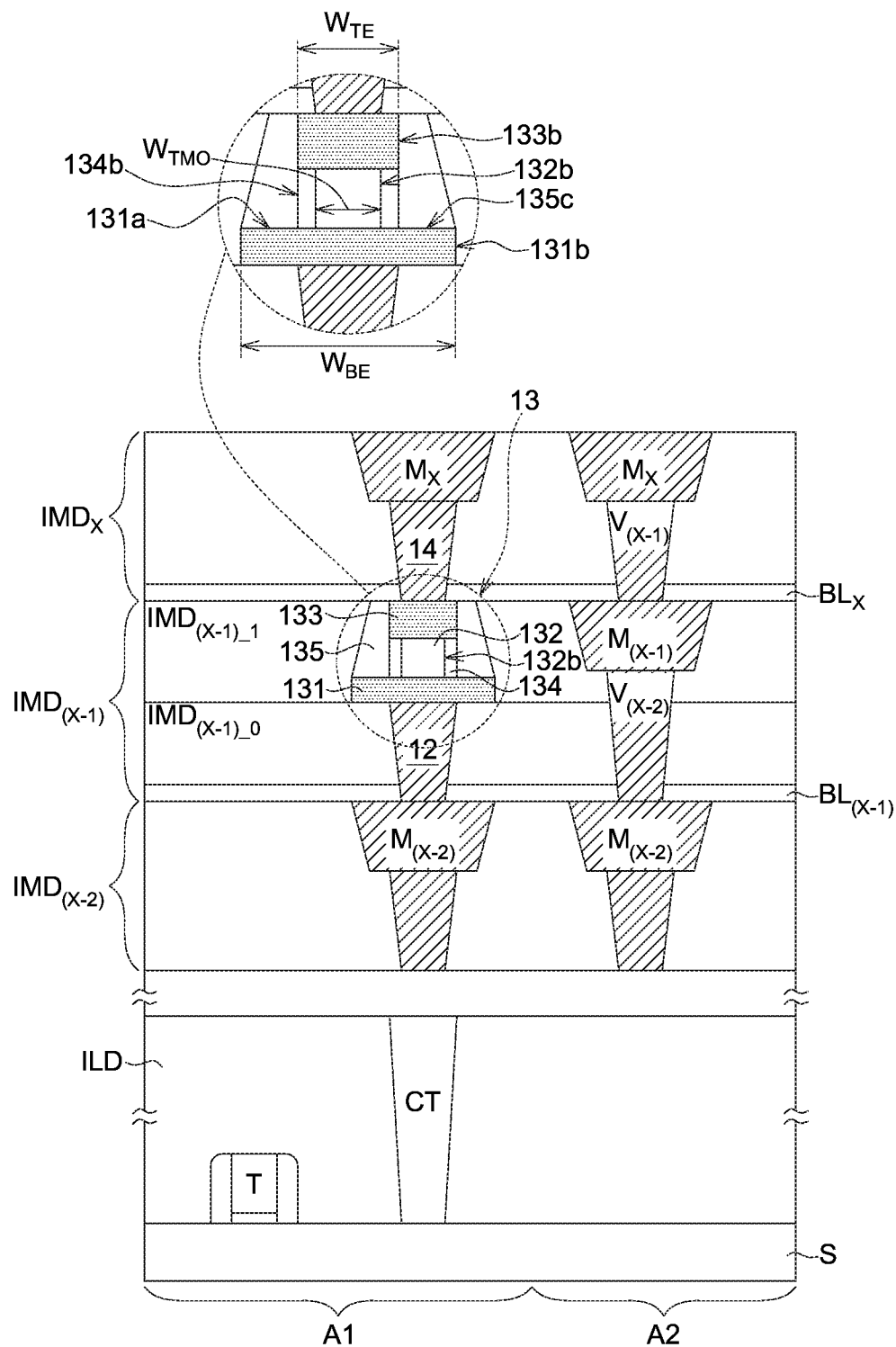
FIG. 1 simply depicts a semiconductor device having a memory cell structure according to the first embodiment of the present disclosure.

In the embodiments of the present disclosure, a semiconductor device having memory cell structures is provided. The memory cell structure of the embodiment is formed in back end of line (BEOL) stack for integration interconnect, and embedded between an upper conducting layer and a lower conducting layer. For example, the embodied memory cell structure can be embedded between an upper contact via and a lower contact via or between the upper and lower metal lines. The semiconductor device of the embodiment can be implemented in the ReRAM (resistive random-access memory) application. According to the semiconductor device of the embodiment, the lower conducting layer (electrically connected to a bottom electrode of a memory cell structure) and the upper conducting layer (electrically connected to a top electrode of the memory cell structure) are positioned in the different dielectric layers, such as positioned in the different inter-metal dielectric (IMD) layers. According to the embodiment, formations of the memory cell structure, the lower conducting layer and the upper conducting layer would be much easier since no thickness increase of the related dielectric layers. Thus, when a memory cell is embedded in a semiconductor device, the embodied design enables the thickness of the related dielectric layer (such as the IMD layers) of the semiconductor device to be maintained or reduced to meet the requirements of the thin and compact product in the application.

Several embodiments are provided hereinafter with reference to the accompanying drawings for describing the related configurations of memory cell structure and the methods for manufacturing the same. Related structural details, such as layers and spatial arrangement, are further described in the embodiments as below. However, the present disclosure is not limited thereto. It is noted that not all embodiments of the invention are shown. The identical and/or similar elements of the embodiments are designated with the same and/or similar reference numerals. Also, it is noted that there may be other embodiments of the present disclosure which are not specifically illustrated. Modifications and variations can be made without departing from the spirit of the disclosure to meet the requirements of the practical applications. It is also important to point out that the illustrations may not be necessarily be drawn to scale. Thus, the specification and the drawings are to be regard as an illustrative sense rather than a restrictive sense.

Moreover, use of ordinal terms such as "first", "second", "third" etc., in the specification and claims to describe an element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

First Embodiment

FIG. 1 simply depicts a semiconductor device having a memory cell structure according to the first embodiment of the present disclosure. According to the embodiment, the semiconductor device comprises an interconnection formed above a substrate S, and the interconnection comprising several interconnect layers respectively buried in the dielectric layers, and each of the interconnect layers may comprise a conductive via (ex: contact via) and a conductive line (ex: metal line). In one embodiment, the dielectric layers above the substrate S includes an inter-layered dielectric (ILD) layer formed on the substrate (covering a gate T, wherein the gate T is electrically connected to the interconnect layer of an BEOL stack through a contact CT) and several inter-metal dielectric (IMD) layers formed in an BEOL stack, wherein the memory cell structure of the embodiment is formed in the BEOL stack for integration interconnect.

In one practical application, a semiconductor device includes a first region A1 such as a memory cell region comprising at least a memory cell structure, and a second region A2 such as a logic region comprising a logic circuit embedded in the dielectric layers. In practical application, a semiconductor device may include several memory cell structures; however, FIG. 1 (and the proposed drawings of the embodiments hereinafter) only schematically shows one memory cell structure for the purpose of clear demonstration.

According to one embodiment, a semiconductor device is provided, comprising a lower conducting layer 12 formed above a substrate S, an upper conducting layer 14, and a memory cell structure 13 formed between the lower conducting layer 12 and the upper conducting layer 14. The memory cell structure 13, formed on the lower conducting layer 12 and buried in one of the dielectric layers, comprises a bottom electrode (BE) 131, a transitional metal oxide (TMO) layer 132 and a top electrode (TE) 133. The bottom electrode 131 is formed on the lower conducting layer 12 and electrically connected to the lower conducting layer 12. The transitional metal oxide (TMO) layer 132 is formed on the bottom electrode 131, and the top electrode 133 is formed on the TMO layer 132. According to the embodied design, the lower conducting layer 12 and the upper conducting layer 14 are positioned in the different dielectric layers.

In this exemplified embodiments, the substrate S having a first area A1 (ex: memory area) and a second area A2 (ex: logic area) is provided, and a device (ex: gate T) disposed on the substrate S is covered by the ILD layer, and an interconnection is formed above the device (ex: gate T) and the ILD layer, wherein the interconnection includes several interconnect layers (ex: M2+V1 (i.e. the second metal layer and the first via), M3+V2, . . . , etc.) respectively buried in the dielectric layers. Each interconnect layer can be represented as a combination of the (x−1)-th metal layer and the (x−2)-th via (i.e. M(x−1)+V(x−2)), wherein x is an integer and x>2. For example, the dielectric layers in one of which the memory cell structure are buried can be referred as the IMD layers. In the embodiment, the IMD layer can be represented as an IMDx layer (which means the x-th IMD layer), wherein x is an integer and x>2. Thus, the IMD layers as exemplified in the related drawings in the embodiments can be labeled as "$IMD_x$", "$IMD_{(x-1)}$" and "$IMD_{(x-2)}$", etc., for illustrating the positions of the lower conducting layer (ex: BE-via, BE-0) 12, the memory cell structure 13 and the upper conducting layer (ex: TE-via, metal, metal plus TE-via) 14 in the first and second embodiments.

Additionally, the (x−1)-th metal layer ($M_{(x-1)}$) and the (x−2)-th via ($V_{(x-2)}$) formed in an (x−1)-th IMD layer ($IMD_{(x-1)}$) of the dielectric layers of the interconnection are formed within the logic area (ex: A2), wherein x is an integer and x>2, while the memory cell structure 13 is formed within the memory cell area (ex: A1) and buried in the (x−1)-th IMD layer ($IMD_{(x-1)}$), as shown in FIG. 1. Moreover, the IMD layer is a multi-layer, may comprise a barrier layer (ex: $BL_x$, $BL_{(x-1)}$ as shown in FIG. 1), a low-k dielectric layer and an oxide layer. In some embodiments, the oxide layer can be replaced by a multilayer comprising a low-k dielectric layer and an oxide layer. The disclosure has no particular limitation thereto.

According to the embodied design, the upper conducting layer 14 is positioned in one of IMD layers (ex: in the (x−1)-th IMD layer, labeled as "$IMD_{(x-1)}$"), and the lower conducting layer 12 is positioned in another IMD layer adjacently (ex: in the (x−2)-th IMD layer, labeled as "$IMD_{(x-2)}$"). The memory cell structure of the embodiment can be positioned in the same dielectric layer (ex: IMD layer) as the upper conducting layer 14 or the lower conducting layer 12; the disclosure has no particular limitation thereto. Accordingly, in the first embodiment, the lower conducting layer 12 and the memory cell structure 13 are positioned in the same dielectric layer (ex: in the (x−1)-th IMD layer, "$IMD_{(x-1)}$"), while the upper conducting layer 14 is positioned in the other dielectric layer (ex: in the x-th IMD layer, "$IMD_x$") above the memory cell structure 13, as shown in FIG. 1.

Moreover, the memory cell structure 13 would be modified for improving the properties and performance of the semiconductor device. According to one embodiment, the memory cell structure 13 further comprises the TMO sidewall oxides 134 and the spacers 135. The TMO sidewall oxides 134 is formed at the sidewalls 132b of the TMO layer 132, and the spacers 135 are formed on the bottom electrode 131. According to one embodiment, the bottom surfaces 135c of the spacers 135 are formed on and directly contact a top surface 131a of the bottom electrode 131. As shown in FIG. 1, the TMO sidewall oxides 134 are formed between the TMO layer 132 and the spacers 135, and shielded by the top electrode 133. In one embodiment, the spacers 135 (such as nitride spacers) are formed adjacent to the sidewalls of the TMO layer 132, and cover (shields) the TMO sidewall oxides 134 and the sidewalls 133b of the top electrode 133. The outer walls 134b of the TMO sidewall oxides 134 are substantially aligned with the sidewalls 133b of the top electrode 133. Also, the spacers 135 formed on the bottom electrode 131 uncover the sidewalls 131b of the bottom electrode 131. Therefore, according to the configuration of an embodied memory cell structure, a width $W_{TMO}$ of the TMO layer 132 is smaller than a width $W_{TE}$ of the top electrode 133. Also, in one embodiment, a width $W_{BE}$ of the bottom electrode 131 is larger than a width $W_{TE}$ of the top electrode 133, and is further larger than a width $W_{TMO}$ of the TMO layer 132.

FIG. 2A-FIG. 2H illustrate a method for manufacturing a semiconductor device having a memory cell structure according to the first embodiment of the present disclosure.

Figure 2A:
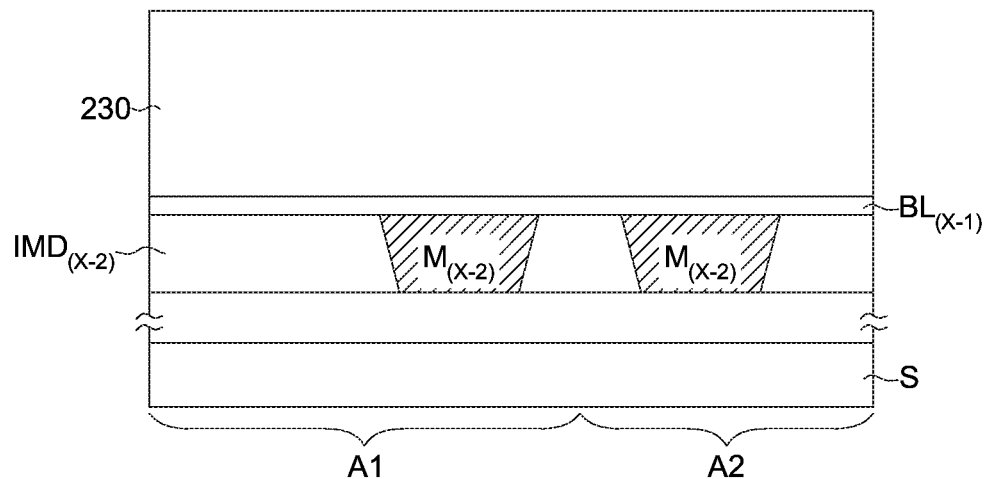
FIG. 2A-FIG. 2H illustrate a method for manufacturing a semiconductor device having a memory cell structure according to the first embodiment of the present disclosure.

As shown in FIG. 2A, a substrate 10, having the (x−1)-th metal layers (labeled as "$M_{(x-1)}$") embedded in the (x−2)-th IMD layer 110 (labeled as "$IMD_{(x-2)}$") being formed at the first region A1 (for constructing a memory cell structure subsequently) and the second region A2 (ex: for forming logic circuit subsequently), is provided, wherein x is an integer and x>2. Then, a barrier layer $BL_x$ is deposited on the $IMD_{(x-2)}$ layer and the $M_{(x-1)}$ layers, followed by depositing another IMD layer 230 (such as a buffer oxide layer). In one embodiment, the thickness of the IMD layer 230 is larger than a height of the logic 1×DD (dual-damascene) via (i.e. a logic 1×DD via height in 55 nm process could be 1000 Å-1500 Å, such as 1250 Å).

Figure 2B:
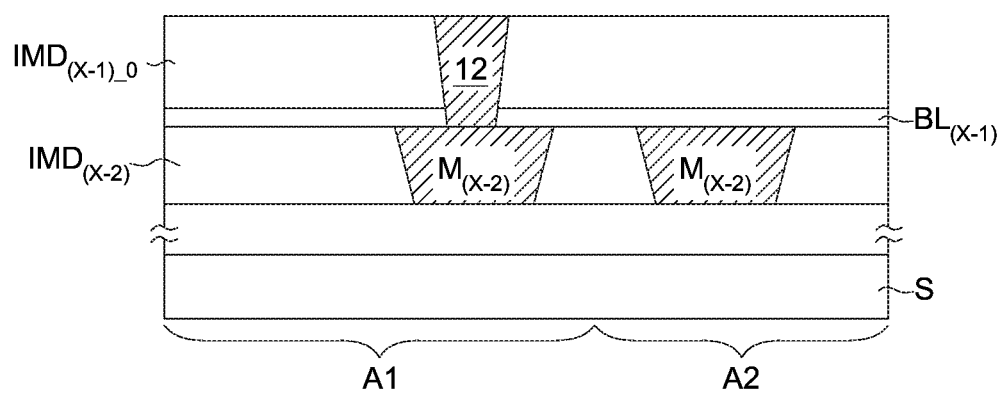

Afterwards, a lower conducting layer 12 such as a lower contact via is formed. For example, the IMD layer 230 is etched to form a BE-trench, and a conductive material is filled in the BE-trench, followed by chemical mechanical polishing (CMP) the IMD layer 230 to form the lower contact via, as shown in FIG. 2B. In this exemplified example, the lower contact via can be referred as a bottom via (BE-via). Also, the patterned IMD layer 230 after CMP is labeled as an $IMD_{(x-1)\_0}$ layer.

Figure 2C:
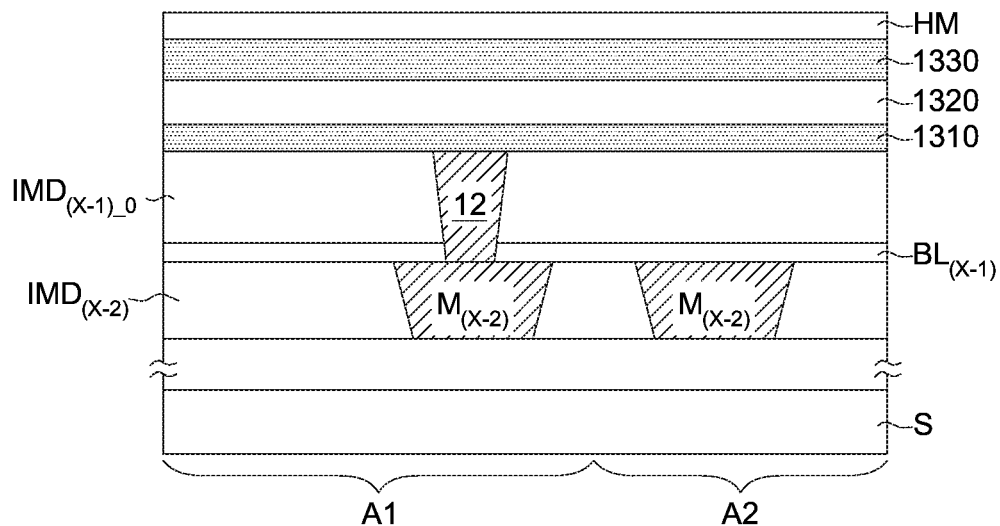
Figure 2D:
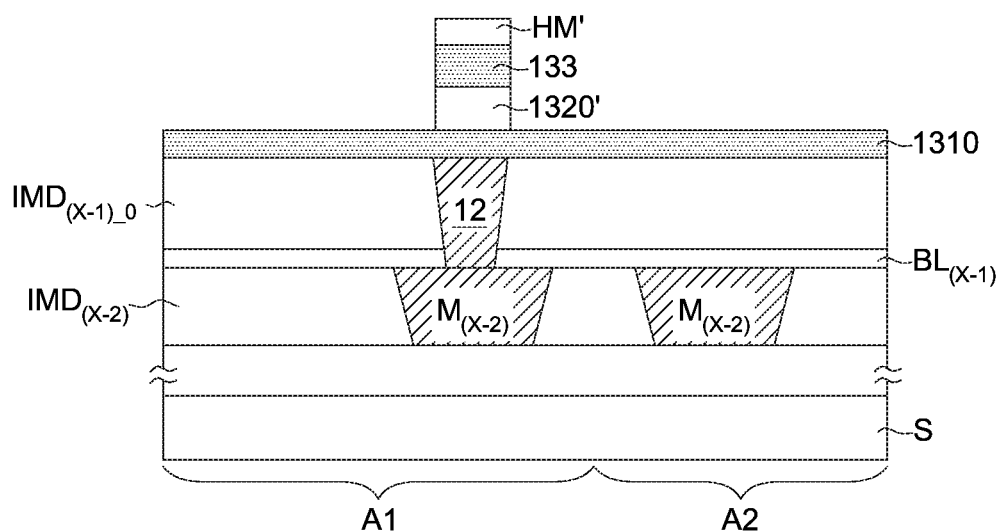
Figure 2E:
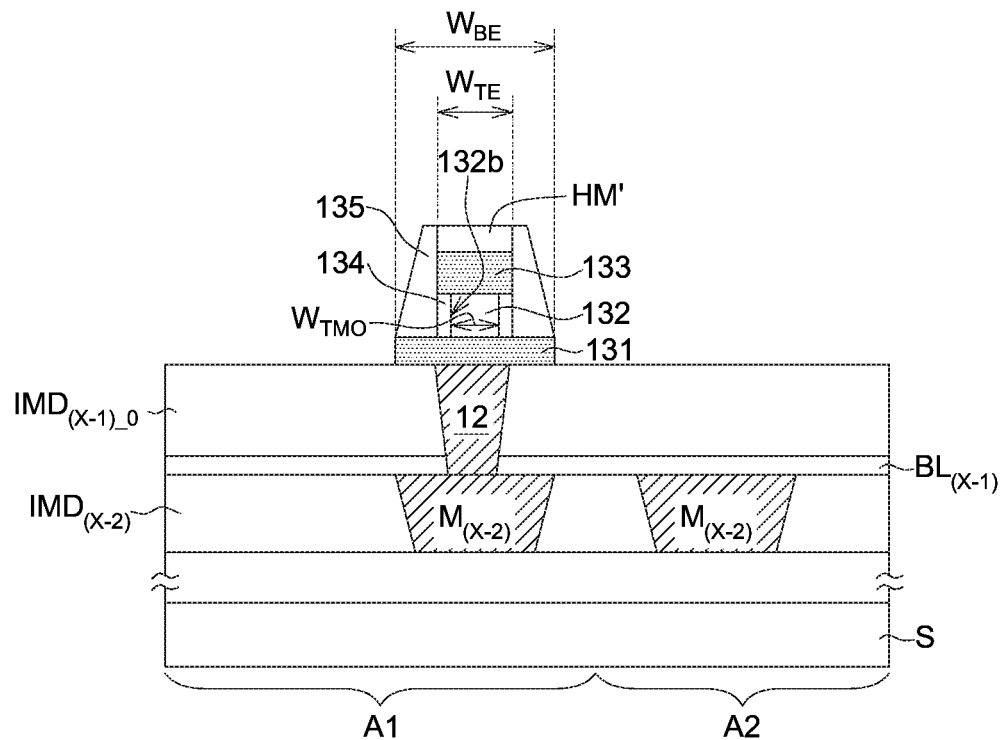

Then, an embodied memory cell structure is constructed on the lower conducting layer 12 as shown in FIG. 2C-FIG. 2E. In FIG. 2C, a bottom electrode layer 1310, a TMO deposition layer 1320 and a top electrode layer 1330 are deposited (such as by PVD, CVD or ALD) on the lower conducting layer 12, followed by capping a hard mask layer (such as silicon nitride or silicon oxide) HM on the top electrode layer 1330. In one embodiment, the TMO layer 132 (/the TMO deposition layer 1320) can be made by a single material or a combination of multiple materials. In FIG. 2D, memory cell lithography is performed; for example, the hard mask layer HM is etched, and the TMO deposition layer 1320 and the top electrode (TE) layer 1330 are patterned to form a TMO-TE stack (comprising a TMO layer 132 and a top electrode 133) on the bottom electrode layer 1310. In FIG. 2E, a sidewall oxidation is conducted to form a TMO sidewall oxides 134 at the sidewalls 132b of the TMO layer 132; also, the spacers 135 (such as silicon nitride) is formed on the bottom electrode layer 1310, and covers the top electrode (TE) 133, the TMO layer 132 and the TMO sidewall oxides 134, followed by defining the bottom electrode 131 (ex: by etching the bottom electrode layer 1310) of the embodied memory cell structure. According to the embodiment, the width $W_{BE}$ of the bottom electrode 131 is larger than the width $W_{TE}$ of the top electrode 133, and the width $W_{TE}$ of the top electrode 133 is larger than the width $W_{TMO}$ of the TMO layer 132, as shown in FIG. 2E.

In one embodiment, material examples of TMO include, but not limited to, HfOx, TaOx, $Ta_2O_5$, TiOx, NiOx, AlOx and others transition metal oxides. For example, the TMO layer 132 can be made by a combination of TaOx and $Ta_2O_5$; however, the disclosure is not limited to the exemplified materials as listed above. Also, the electrode can be made by a single material or a combination of multiple materials. Material examples of the electrodes (ex: the top electrode 133 and the bottom electrode 131) include, but not limited to, TiN, TaN, Pt, Ir, or other suitable conducting materials. For example, the electrode can be made by TiN and Pt, or made by TiN and Ir, or other suitable conducting materials; however, the disclosure is not limited to the exemplified materials as listed above.

Figure 2F:
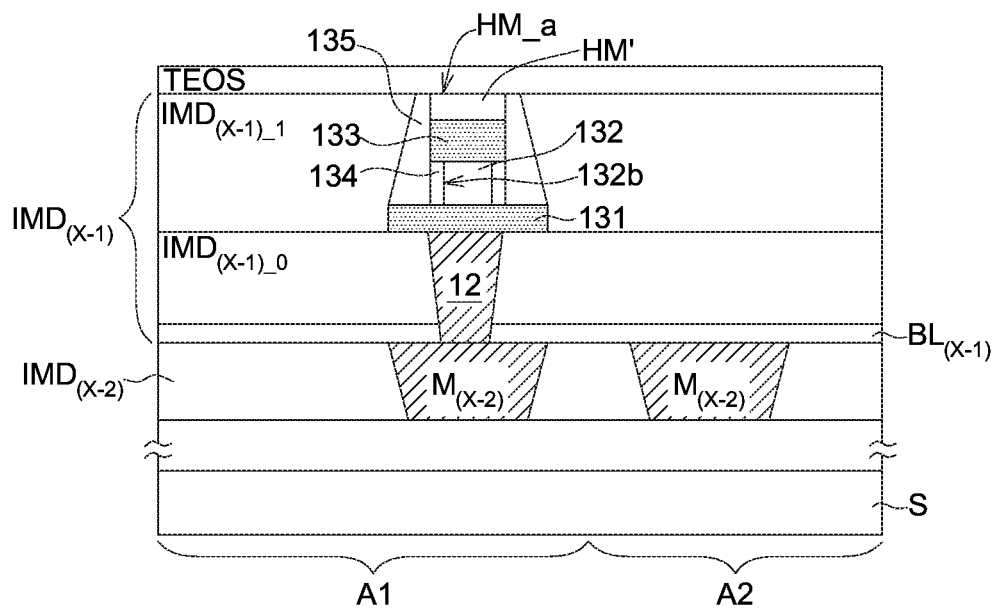

Afterwards, another inter-metal dielectric layer labeled as "$IMD_{(x-1)\_1}$" layer is deposited to covers the embodied memory cell structure, and partially removed by chemical mechanical polishing (CMP) to expose the top surface HM-a of the patterned hard mask layer HM', followed by capping a TEOS (tetraethyl orthosilicate) layer, as shown in FIG. 2F. The $IMD_{(x-1)}$ layer includes the barrier layer $BL_x$, the $IMD_{(x-1)\_0}$ layer and the $IMD_{(x-1)\_1}$ layer.

Figure 2G:
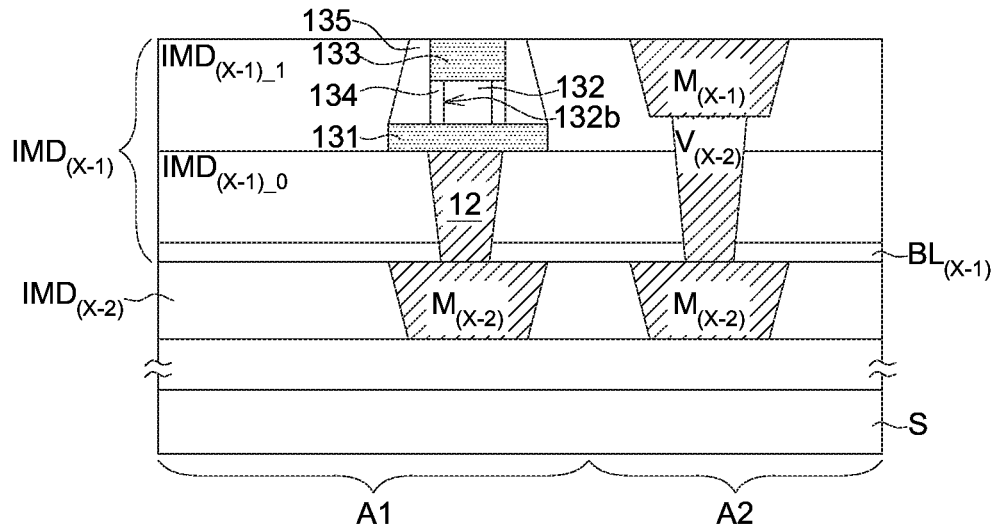

Next, a copper dual-damascene (DD) fabrication process (ex: 1×DD process) is conducted to form the via and the metal layer in the second region A2 (ex: logic region), such as forming the (x-2)-th via labeled as "$V_{(x-2)}$" connected to the $M_{(x-2)}$ layer and the (x-1)-th metal layer labeled as "$M_{(x-1)}$" connected to the $V_{(x-2)}$, as shown in FIG. 2G.

Figure 2H:
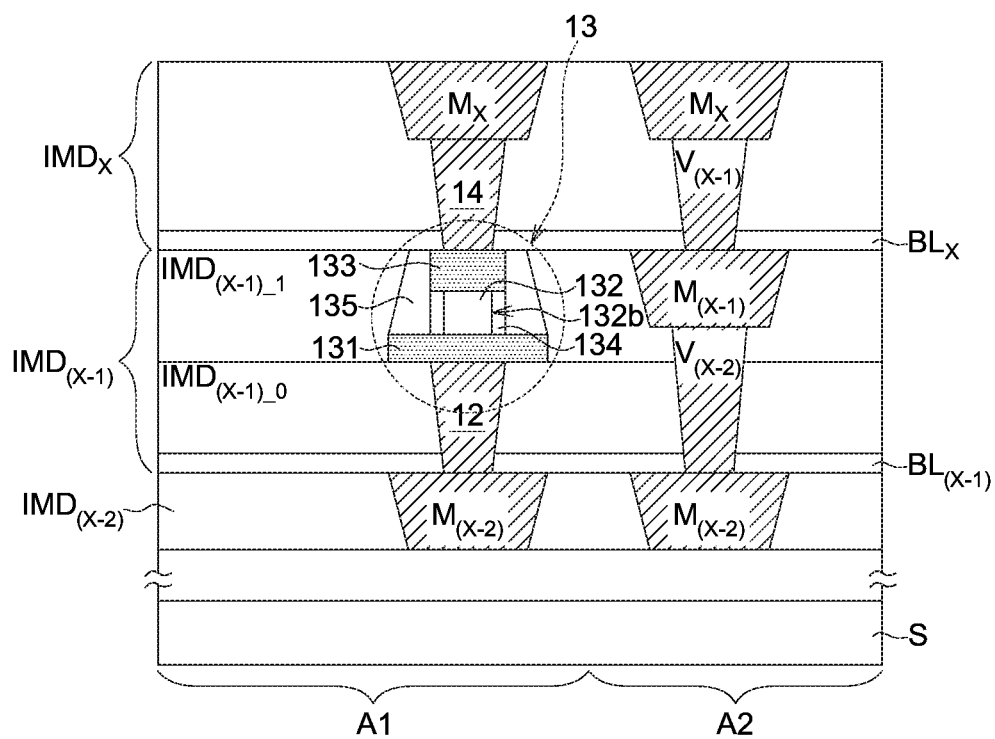

Then, another IMD layer (such as including another barrier layer $BL_x$ and another dielectric) labeled as "$IMD_x$" is deposited, followed by conducting the next copper dual-damascene fabrication process (ex: the next 1×DD process), so as to form an upper conducting layer 14 such as an upper contact via (ex: filled with copper) or upper metal line above the memory cell structure 13 in the first region A1 (ex: memory cell region), and to form a copper DD interconnect (ex: $M_x+V_{(x-1)}$) in the second region A2 (ex: logic region), as shown in FIG. 2H.

Figure 3:
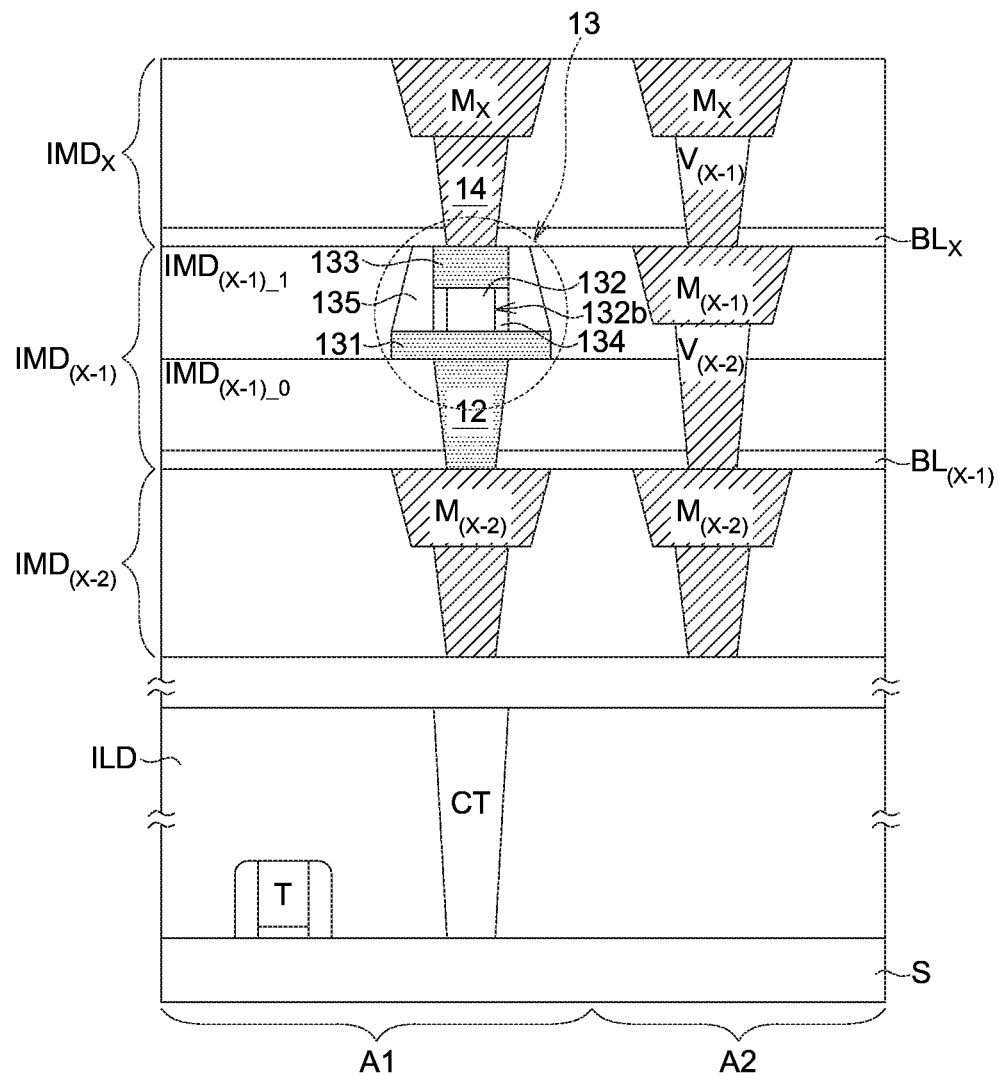
FIG. 3 simply depicts another semiconductor device having a memory cell structure according to the first embodiment of the present disclosure.

FIG. 3 simply depicts another semiconductor device having a memory cell structure according to the first embodiment of the present disclosure. The identical and/or similar elements in FIG. 1 and FIG. 3 are designated with the same and/or similar reference numerals, and the details of the configurations and fabricating steps of the identical components/layers are not redundantly repeated. Please also refer to FIG. 1. The semiconductor device of FIG. 3 is identical to the semiconductor device of FIG. 1, except for the material for forming the lower conducting layer 12. In FIG. 1 and FIG. 3, the lower conducting layer 12 is a lower contact via connected to a lower metal line layer, and the lower contact via is filled with a conductive material. As shown in FIG. 1, the conductive material in the lower contact via (i.e. the lower conducting layer 12) is different from the material of the bottom electrode 131; but the disclosure is not limited thereto. As shown in FIG. 3, the conductive material in the lower contact via (i.e. the lower conducting layer 12) can be the same as the material of the bottom electrode 131.

Additionally, although FIG. 1 (and the proposed drawings of the embodiments hereinafter) illustrates that the upper conducting layer 14 above the embodied memory cell structure is an upper contact via (ex: filled with conductive material such as Cu) connected to the top electrode 133 of the memory cell structure, the present disclosure is not limited to this configuration. In some applications, the upper conducting layer 14 could be an upper metal line layer (i.e. without forming contact) directly connected to the top electrode 133 of the memory cell structure.

Second Embodiment

Figure 4:
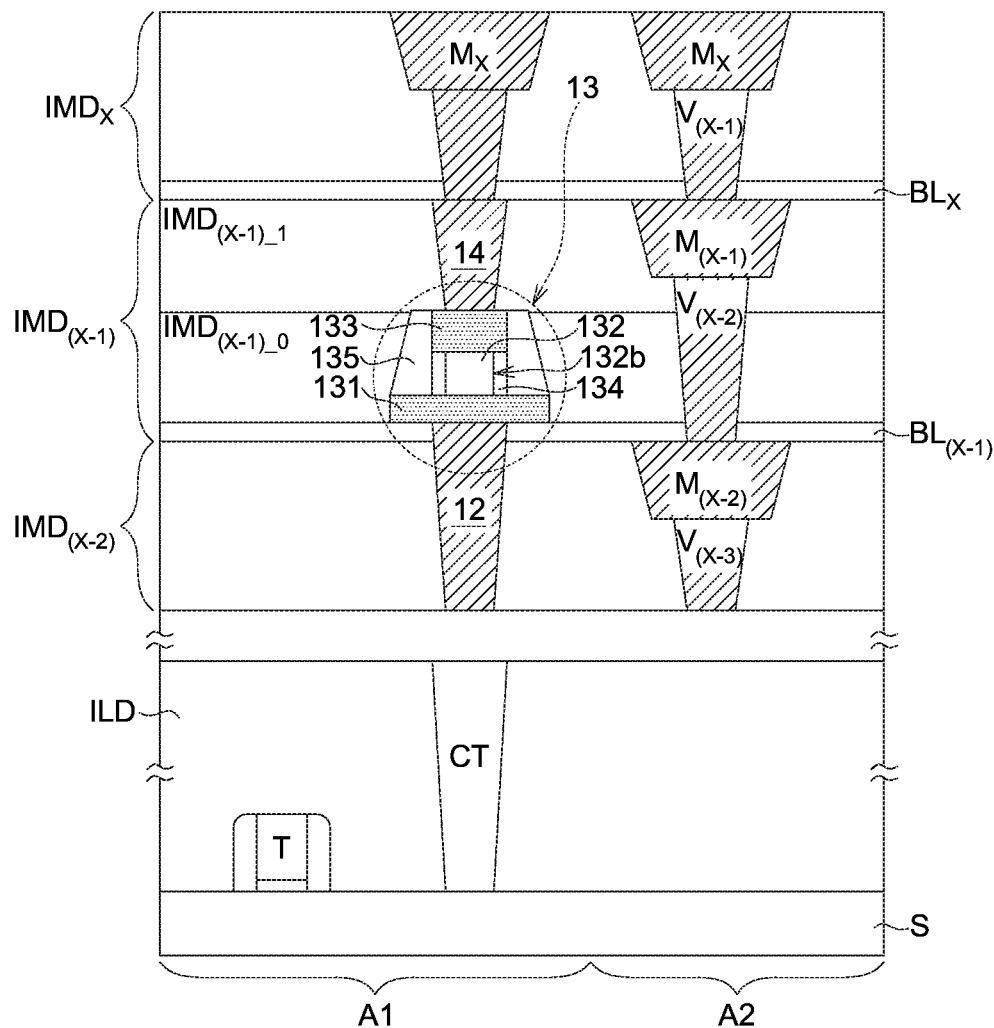
FIG. 4 simply depicts a semiconductor device having a memory cell structure according to the second embodiment of the present disclosure.

FIG. 4 simply depicts a semiconductor device having a memory cell structure according to the second embodiment of the present disclosure. The identical and/or similar elements in FIG. 4 and FIG. 1 are designated with the same and/or similar reference numerals, and the details of the configurations and fabricating steps of the identical components/layers are not redundantly repeated. Please also refer to FIG. 1. The semiconductor device of the second embodiment is identical to the semiconductor device of the first embodiment, except for the positions of the lower conducting layer 12 and the upper conducting layer 14.

In the first embodiment, the lower conducting layer 12 and the memory cell structure 13 are positioned in the same dielectric layer (ex: in the $IMD_{(x-1)}$ layer), while the upper conducting layer 14 is positioned in the other dielectric layer (ex: in the $IMD_x$ layer) above the memory cell structure 13, as shown in FIG. 1. In the second embodiment, the upper conducting layer 14 and the memory cell structure 13 are positioned in the same dielectric layer (ex: in the $IMD_{(x-1)}$ layer), while the lower conducting layer 12 is positioned in the other dielectric layer (ex: in the $IMD_{(x-2)}$ layer) beneath the memory cell structure 13.

According to the aforementioned descriptions, the semiconductor device of the embodiment(s) possesses many advantages. According to the embodied semiconductor devices mentioned above, since the lower conducting layer 12 (such as the via filled with Cu connected to the BE 131 (can be referred as BE-via) or via filled with the same material as the BE 131 (can be referred as BE-0)) and the upper conducting layer 14 (such as the TE-via, Metal, or Metal+TE-via) are formed in different dielectric layers, it would be much easier to form the memory cell structure, the BE-VIA and the TE-VIA without increasing the thickness of the related dielectric (such as the IMD) layer. Thus, when a memory cell is embedded in a semiconductor device, the embodied design enables the thickness of the related dielectric (such as the IMD) layer of the semiconductor device to be maintained or reduced to meet the requirements of the application product, especially the thin and compact application products. Also, the manufacturing method of the embodied semiconductor device is compatible with the current fabrication process, which is suitable for mass production.

Moreover, according to the embodied memory cell structures as shown in FIG. 1 and FIG. 3 (having the wider bottom electrode, the TMO sidewall oxides 134 and the spacers 135), the electrical properties and performance of the semiconductor device in the application can be significantly improved. In the fabrication of memory cell, the etching procedure for pattering the top electrode, the TMO layer and the bottom electrode use $Cl_2$ or HBr gas for better selectivity. However, $Cl_2$ or HBr gas also causes damage to the copper (ex: material for filling vias) if the lower conducting layer (ex: contact via) made by copper is exposed during the fabrication. Therefore, according to one embodied memory cell structure, the width $W_{BE}$ of the bottom electrode 131 is larger than a width $W_{TE}$ of the top electrode 133, so that the exposure issue of the lower conducting layer 12 (such as Cu via, via for connecting the bottom electrode of the memory cell) can be solved. Moreover, formations of the TMO sidewall oxides 134 and the spacers 135 (ex: the spacers are formed adjacent to the sidewalls of the TMO layer 132, and cover the TMO sidewall oxides 134 and the sidewalls 133b of the top electrode 133) prevent the top electrode-bottom electrode (TE-BE) bridge and TMO damage if alignment/landing shift of the upper conducting layer 14 (ex: upper contact via) occurs during fabrication.

Other embodiments with different configurations of known elements in the semiconductor device can be applicable, and the arrangement depends on the actual needs of the practical applications. It is, of course, noted that the configurations of figures are depicted only for demonstration, not for limitation. It is known by people skilled in the art that the shapes or positional relationship of the constituting elements and the procedure details could be adjusted according to the requirements and/or manufacturing steps of the practical applications.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor device, comprising:
    an interconnection formed above a substrate, and the interconnection comprising interconnect layers respectively buried in dielectric layers;
    a lower conducting layer, formed above the substrate;
    a memory cell structure, formed on the lower conducting layer and buried in one of the dielectric layers, and the memory cell structure comprising:
        a bottom electrode, formed on and electrically connected to the lower conducting layer;
        a transitional metal oxide (TMO) layer, formed on the bottom electrode;
        a top electrode, formed on the TMO layer; and
        a TMO sidewall oxide, formed at sidewalls of the TMO layer, and the top electrode formed on the TMO sidewall oxide, and
    an upper conducting layer, formed on the top electrode and electrically connected to the top electrode,
    wherein the lower conducting layer and the upper conducting layer are positioned in the different dielectric layers.

2. The semiconductor device according to claim 1, wherein the lower conducting layer and the memory cell structure are positioned in the same dielectric layer, while the upper conducting layer is positioned in the other dielectric layer above the memory cell.

3. The semiconductor device according to claim 1, wherein the upper conducting layer and the memory cell structure are positioned in the same dielectric layer, while the lower conducting layer is positioned in the other dielectric layer beneath the memory cell.

4. The semiconductor device according to claim 1, wherein the lower conducting layer is a lower contact via connected to a lower metal line layer, and the lower contact via is filled with a conductive material.

5. The semiconductor device according to claim 4, wherein the conductive material in the lower contact via is different from a material of the bottom electrode.

6. The semiconductor device according to claim 4, wherein the conductive material in the lower contact via is the same as a material of the bottom electrode.

7. The semiconductor device according to claim 1, wherein the substrate has a memory cell region and a logic region, and a (x−1)-th metal layer (M(x−1)) and a (x−2)-th via (V(x−2)) formed in an (x−1)-th inter-metal dielectric (IMD) layer (IMD(x−1)) of the dielectric layers of the interconnection are formed within the logic area, x is an integer and x>2, wherein the memory cell structure is formed within the memory cell area and buried in the (x−1)-th IMD layer (IMD(x−1)).

8. The semiconductor device according to claim 7, wherein the upper conducting layer comprises an upper contact via connected to the top electrode of the memory cell structure, wherein a material for filling the upper contact via is the same as a material for filling the (x−1)-th metal layer (M(x−1)) and the (x−2)-th via (V(x−2)) within the logic area.

9. The semiconductor device according to claim 8, wherein a conductive material filled in the upper contact via is different from a material of the bottom electrode.

10. The semiconductor device according to claim 8, wherein the upper conducting layer further comprises an upper metal layer formed on and connected to the upper contact via, wherein a material for filling the upper metal layer and the upper contact via within the memory cell area is the same as a material for filling the (x−1)-th metal layer and the (x−2)-th via within the logic area.

11. The semiconductor device according to claim 7, wherein the upper conducting layer comprises a metal layer connected to the top electrode of the memory cell structure, wherein a material for filling the upper metal layer is the same as a material for filling the (x−1)-th metal layer and the (x−2)-th via within the logic area.

12. The semiconductor device according to claim 7, wherein the lower conducting layer is formed in the (x−1)-th IMD layer, and the upper conducting layer above the memory cell structure is formed in an x-th IMD (IMDx) layer of the dielectric layers.

13. The semiconductor device according to claim 7, wherein the lower conducting layer is formed in an (x−2)-th IMD layer (IMD(x−2)), and the upper conducting layer above the memory cell structure is formed in the (x−1)-th IMD layer of the dielectric layers.

14. The semiconductor device according to claim 1, wherein a width of the bottom electrode is larger than a width of the top electrode.

15. The semiconductor device according to claim 1, wherein a width of the TMO layer is smaller than a width of the top electrode.

16. The semiconductor device according to claim 1, wherein the memory cell structure further comprises:
spacers, formed on the bottom electrode, and the spacers covers sidewalls of the top electrode.

17. The semiconductor device according to claim 16, wherein bottom surfaces of the spacers are formed on a top surface of the bottom electrode, and the bottom surfaces of the spacers directly contact the top surface of the bottom electrode.

18. The semiconductor device according to claim 16, wherein the spacers uncover sidewalls of the bottom electrode.

19. The semiconductor device according to claim 1, wherein the top electrode shields the TMO sidewall oxide.

* * * * *